United States Patent [19]
Counts

[11] Patent Number: 5,331,253
[45] Date of Patent: Jul. 19, 1994

[54] ELECTRONIC BALLAST FOR GASEOUS DISCHARGE LAMP OPERATION

[75] Inventor: Richard C. Counts, Dallas, Tex.

[73] Assignee: USI Lighting, Inc., San Leandro, Calif.

[21] Appl. No.: 934,411

[22] Filed: Aug. 24, 1992

[51] Int. Cl.$^5$ ............................................. H05B 37/02
[52] U.S. Cl. .................... 315/209 R; 315/219; 315/307; 315/291; 315/DIG. 5; 315/DIG. 7
[58] Field of Search ............. 315/209 R, 219, 307, 315/291, DIG. 5, DIG. 7

[56] References Cited

U.S. PATENT DOCUMENTS

| | | | |
|---|---|---|---|
| 4,472,057 | 9/1984 | Wurm et al. | 356/380 |
| 4,612,479 | 9/1986 | Zansky | 315/194 |
| 4,677,346 | 6/1987 | Roberts et al. | 315/226 |
| 4,700,113 | 10/1987 | Stupp et al | 315/224 |
| 4,704,563 | 11/1987 | Hussey | 315/307 |

FOREIGN PATENT DOCUMENTS 2259197  3/1993  United Kingdom ....... H05B 41/392

Primary Examiner—Robert J. Pascal
Assistant Examiner—Reginald A. Ratliff
Attorney, Agent, or Firm—Thomas E. Schatzel

[57] ABSTRACT

An embodiment of the present invention is a lighting system comprising a full-wave bridge, a filter capacitor, a control logic that drives a pair of output transistors and an output network that includes an output transformer that powers a pair of fluorescent lamps. The output transformer has a natural resonant frequency that will produce maximum power transfer to the lamps if the transistors are switched by the control logic at a rate near the natural resonant frequency. Precise frequency control within the control logic maintain consistent levels of output current through the lamps by phase lock loop (PLL) synchronizing its output switching frequency to the sixty Hz commercial line frequency, as sampled through a resistor and a digital integrator that prevents false triggering.

6 Claims, 4 Drawing Sheets

ELECTRONIC BALLAST FOR GASEOUS DISCHARGE LAMP OPERATION

BACKGROUND OF THE INVENTION

1. Field of the Invention

The present invention relates generally to fluorescent lamp electronic ballasts, and more specifically to a cost effective structure for controlling fluorescent lamp current from an electronic ballast.

2. Description of the Prior Art

Incandescent lamps are relatively inexpensive compared to fluorescent lamp systems, but fluorescent lamps are more cost effective to operate because they can produce the same amount of light with much less electrical energy. A significant part of the initial cost of a fluorescent lamp system is the ballast. Fluorescent tubes express a negative resistance characteristic that must be controlled in order to maintain consistent light output and long life. Ballasts are also used to start the gaseous discharge tubes and to generate the required voltages, which are substantially higher than ordinary 110 VAC.

Integrated circuit technology has provided for lower cost ballasts and therefore the cost of a fluorescent lamp system. Ballasts are produced and used in very high quantities and a savings of one or two dollars per ballast can account for millions of dollars of savings and can tip the balance between a choice of incandescent or fluorescent lights. Generally, as the functions integrated onto a chip increase, the cost of a ballast decreases.

Electronic ballasts generally employ an oscillator that sets the fundamental frequency of output switching transistors that drive a transformer output network. The output network will deliver power to the fluorescent tubes that varies with the frequency of the oscillator and the value of resistors, capacitors, and inductors in the ballast and output network. Production variances in component values can lead to inconsistent light output from unit to unit if not otherwise controlled. A common, albeit relatively expensive, method of controlling lamp performance is to measure or sample the output current flowing through the lamps and to feed that sample current back to a current controlling oscillator. The oscillator may be voltage controlled since the frequency output will directly control output current.

Output current feedback control is expensive because it requires components that cannot readily be integrated on a chip and typically requires a winding on the output transformer or sense transformer to sense output current. Precision oscillator frequency control in the prior art has also been costly because such precision required the use of sophisticated oscillators and crystals.

Thus, there is a need for a structure providing precision oscillator frequency control that can be readily integrated into a semiconductor chip and that limits the effects of production variances that may occur in component values.

SUMMARY OF THE PRESENT INVENTION

It is therefore an object of the present invention to provide a system for control of the operational frequency of an electronic ballast.

Briefly, an embodiment of the present invention is a lighting system comprising a full-wave bridge, a filter capacitor, a control logic that drives a pair of output transistors and an output network including an output transformer that powers a pair of fluorescent lamps. The output transformer has a natural resonant frequency that will produce maximum power transfer to the lamps if the transistors are switched by the control logic at a rate near the natural resonant frequency. Precise frequency control within the control logic maintains consistent levels of output current through the lamps by phase lock loop (PLL) synchronizing its output switching frequency to the sixty Hz commercial line frequency, as sampled through a resistor and a digital integrator that prevents false triggering.

An advantage of the present invention is that it provides a lighting system ballast that may be readily integrated into a semiconductor chip.

A further advantage of the present invention is that it provides an inexpensive means of precision frequency control in a fluorescent light ballast.

These and other objects and advantages of the present invention will no doubt become obvious to those of ordinary skill in the art after having read the following detailed description of the preferred embodiments which are illustrated in the various drawing figures.

IN THE DRAWINGS

DETAILED DESCRIPTION OF THE PREFERRED EMBODIMENTS

Figure 1:
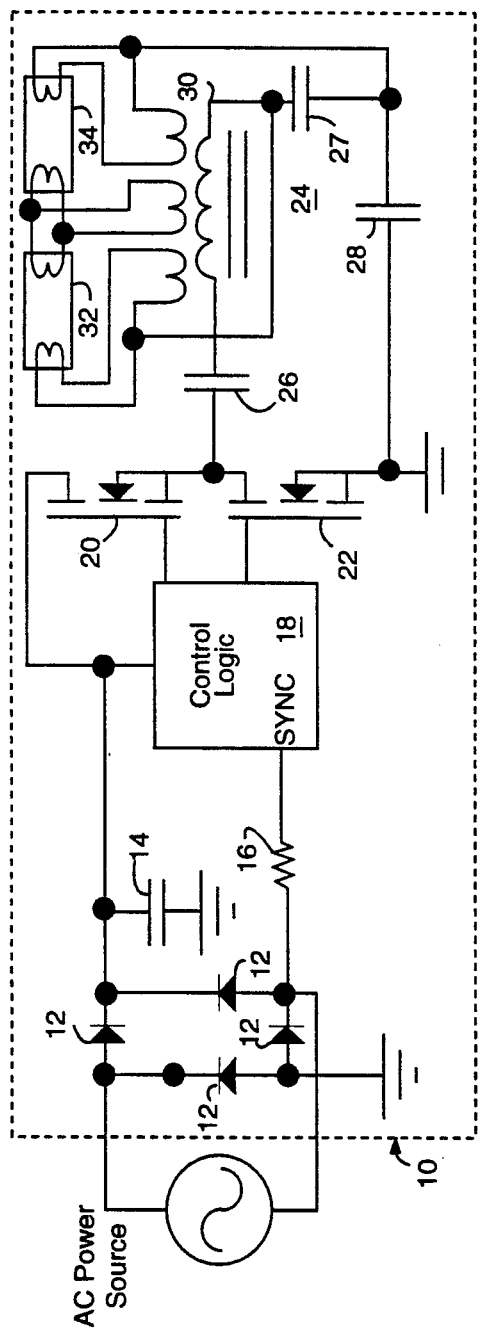
FIG. 1 is a simplified schematic diagram of a lighting system embodiment of the present invention.

FIG. 1 illustrates a lighting system embodiment of the present invention, referred to by the general reference numeral 10, that comprises a group of four diodes 12 in a full-wave bridge configuration, a filter capacitor 14, a dropping resistor 16, a control logic 18 that drives a pair of output transistors 20 and 22, and an output network 24 that includes a set of three capacitors 26–28 and an output transformer 30 that powers a pair of fluorescent lamps 32 and 34. Other types of gaseous discharge lamps may also be adapted in place of lamps 32 and 34. Capacitors 26–28 and output transformer 30 have a natural resonant frequency that will produce maximum power transfer to lamps 32 and 34 if transistors 20 and 22 are switched by control logic 18 at a rate near the natural resonant frequency. Precise frequency control within control logic 18 is needed to maintain consistent levels of output current through lamps 32 and 34 across large production runs. Control logic 18 synchronizes its output switching frequency to the sixty Hz commercial line frequency as sampled through resistor 16.

Figure 2:
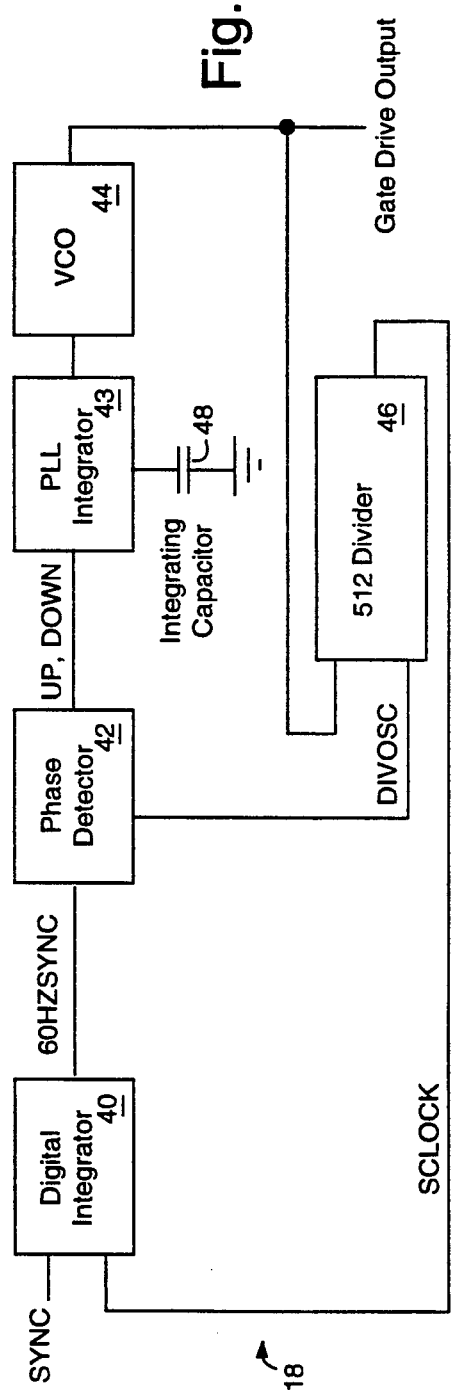
FIG. 2 is a first block diagram of the control logic for the lighting system of FIG. 1.

FIG. 2 represents a block diagram of control logic 18 and includes a digital integrator 40, a phase detector 42, a PLL integrator 43, a voltage controlled oscillator (VCO) 44 and a divide-by-512 counter 46. Control logic 18 may also be referred to by those skilled in the art as an electronic ballast. An integrating capacitor 48 smoothes an analog representation of the phase difference between the sixty Hz line (SYNC) and the output of counter 46. VCO 44 operates at 30,720 Hz (512×60)

and will slew in frequency and in phase according to the voltage across integrating capacitor 48. The output of VCO 44 is coupled to transistors 20 and 22.

Figure 3:
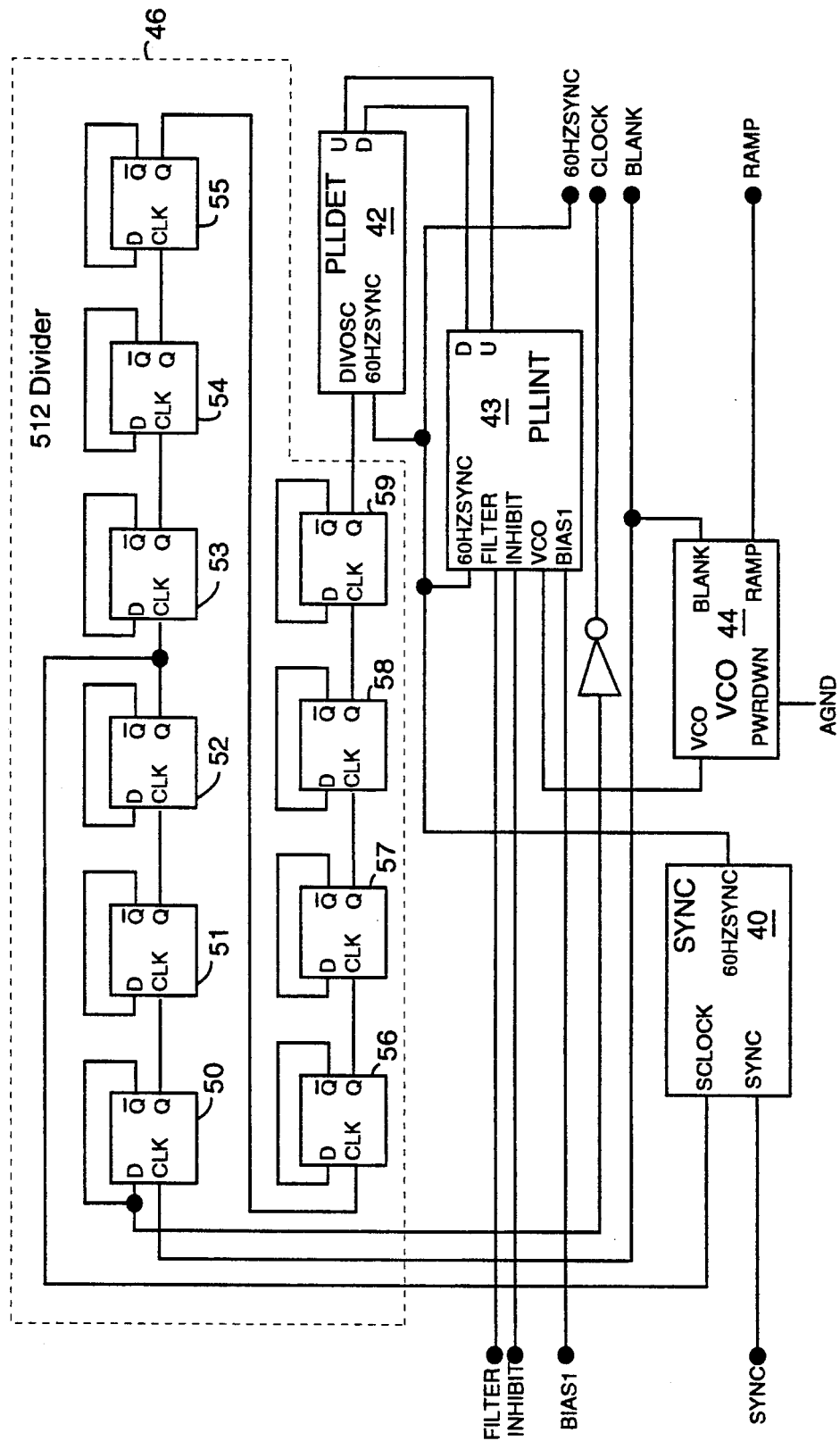
FIG. 3 is a second block diagram of the control logic for the lighting system of FIG. 1.

FIG. 3 is a more detailed example of an implementation for that shown in FIG. 2. A sample of the sixty Hz incoming power is provided at a terminal labeled SYNC. VCO 44 produces an ultrasonic frequency (BLANK) that is input to counter 46 for division down to the power line frequency (e.g., the sixty Hz SYNC). The ramp time of VCO 44 may be initially fixed by connecting selected resistive and/or capacitive elements to a terminal labeled RAMP. The BLANK signal is also used for the gate drive output to transistors 20 and 22. Counter 46 comprises a cascade of ten individual flip-flops 50–59 that perform a digital serial pulse division by 512 that is available at the output of flip-flop 59 and that is referred to herein as DIVOSC. Flip-flop 50 outputs a signal labeled CLOCK that is available to clock auxiliary circuits and is fixed at half the output frequency (BLANK) of VCO 44. A signal (SCLOCK) is tapped from the output of flip-flop 52 to provide a convenient sampling clock for digital integrator 40 to gather samples of the incoming SYNC signal at a harmonic of sixty Hz (e.g., $60 \times 2^7$ Hz). Differences in the two input signals (DIVOSC and 60HZSYNC) to phase detector 42 result in either up (U) or down (D) output pulses that are applied to PLL integrator 43. Integrating capacitor 48 typically connects to a terminal labeled FILTER on PLL integrator 43. The output to transistors 20 and 22 can be temporarily suspended by a signal on a terminal labeled INHIBIT. And input signal to a terminal labeled BIAS1 can be used to adjust the current drawn in output transformer 30 by affecting the VCO lock frequency.

Figure 4:
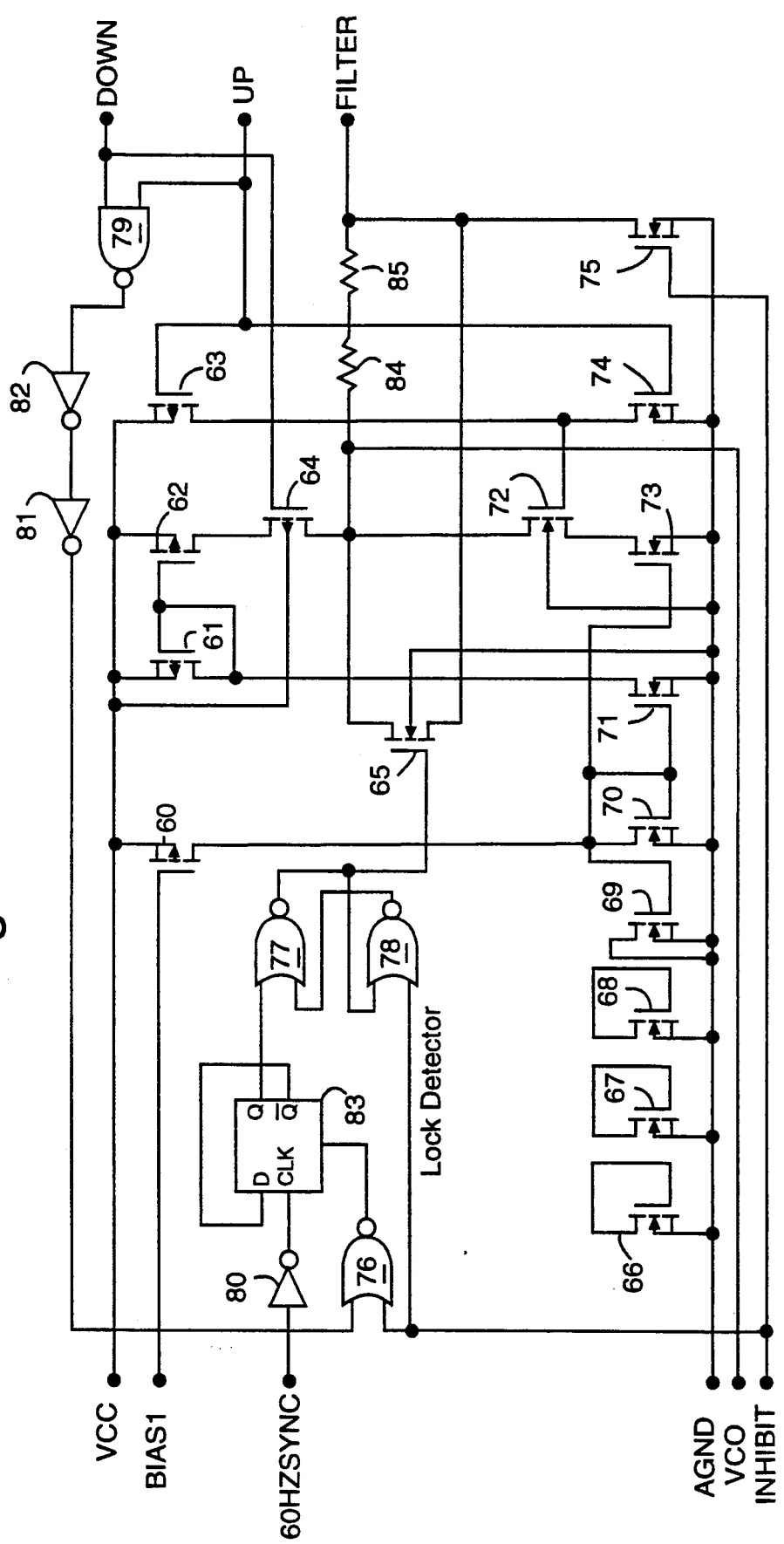
FIG. 4 is a schematic diagram of an exemplary implementation of the PLL integrator of FIGS. 2 and 3.

FIG. 4 illustrates an example of an implementation of digital integrator 40 that comprises a plurality of transistors 60–75, a set of three NOR-gates 76–78, a NAND-gate 79, inverters 80–82, a flip-flop 83, and a pair of resistors 84 and 85. Flip-flop 83, inverter 80 and NOR-gates 76–78 form a lock detector that uses transistor 65 to short circuit resistors 84 and 85. Integrating capacitor 48 connects between ground and a terminal labeled FILTER. The lock detector is used only once during the initial power-up. This circuit prevents instantaneous changes in the VCO frequency by shorting resistors 84 and 85, thus allowing the filter capacitor to damp any voltage transients generated by the phase detector as the VCO sweeps towards the lock frequency. The circuit of inverter 80, NOR-gate 76 and flip-flop 83 detects when the VCO frequency has passed the lock frequency. When this happens, the short across resistors 84 and 85 is removed by turning off transistor 65. Critical damping is therefore restored to the PLL because the flip-flop 83 is then permanently off, unless power is reset (off and then on) to the circuit. The purpose of digital integrator 40 is to provide a smooth start-up after power interruption. Without the lock detector, the VCO would jitter during initial lock due to the digital nature of the phase detector and the effect of resistors 84 and 85. But resistors 84 and 85 are needed to critically damp the PLL at other times. The lock detector compromises by shorting out resistors 84 and 85 only during initial power-up.

Figure 5:
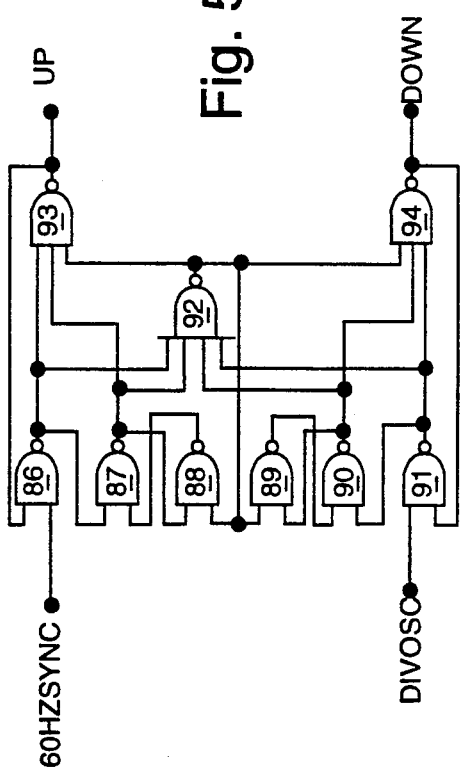
FIG. 5 is a schematic diagram of an exemplary implementation of the phase detector of FIGS. 2 and 3.

FIG. 5 illustrates an example of an implementation of phase detector 42 that includes a plurality of NAND-gates 86–94. Two incoming signals with frequencies that are to be compared are input to nodes 60HZSYNC and DIVOSC. Label60HZSYNC corresponds to the reference frequency to which the variable frequency, DIVOSC, is to be locked. The output nodes are UP and DOWN and are driven be NAND-gates 93 and 94, respectively. When the variable frequency DIVOSC lags in phase to the reference frequency 60HZSYNC, output node UP will toggle while output node DOWN remains high. When the variable frequency leads in phase to the reference frequency, output node UP will remain high while output node DOWN toggles. The time duration that either UP or DOWN remains low is a function of the phase difference between the input frequencies. The smaller the phase difference, the smaller a time either output node UP or DOWN will remain low. A commercially available phase detector, e g , the Motorola MC4344, may also be adapted for use as phase detector 42. Initially, 60HZSYNC and DIVOSC inputs will be high and both outputs UP and DOWN will be high. If 60HZSYNC goes low, NAND-gate 86 will output a high to NAND-gates 87 and 93. NAND-gates 87 and 88, and NAND-gates 89 and 90 are each cross-connected as pairs to form two reset-set (RS) flip-flops. The low at the output of NAND-gate 86 causes the output of NAND-gate 93 to go low. Thus NAND-gate 86 locks with its output high. The output of NAND-gate 93 will go low, outputting an UP pulse, since the inputs from NAND-gates 87 and 92 are high. The UP output will stay low until a DIVOSC signal is received. The receipt of a DIVOSC pulse going low will cause all four inputs to NAND-gate 92 to be high and this will reset the RS flip-flops at NAND-gates 88 and 89. Both UP and DOWN outputs will return high. The DOWN output will go low first and stay down longer if DIVOSC going low is received before 60HZSYNC going low. The difference in UP and DOWN will represent and track the difference in phase and frequency between DIVOSC and 60HZSYNC.

Figure 6:
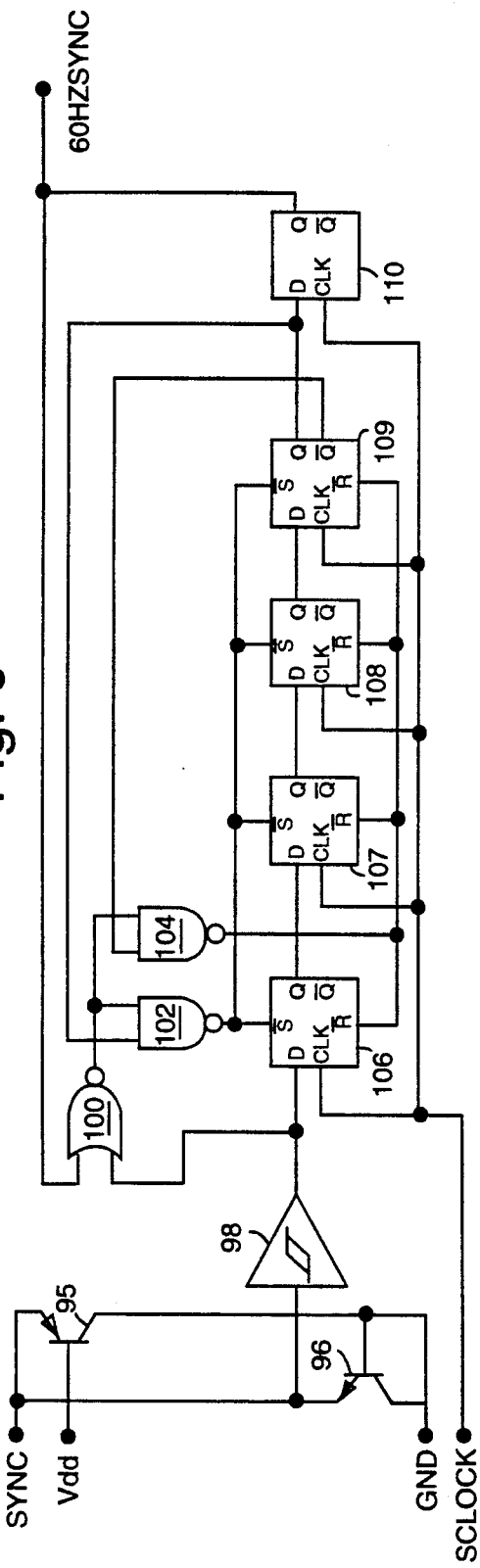
FIG. 6 is a schematic diagram of an exemplary implementation of the digital integrator of FIGS. 2 and 3.

An exemplary implementation of digital integrator 40 is shown in FIG. 6 and includes a pair of transistors 95 and 96, a buffer 98 with hysteresis, a NOR-gate 100, a pair of NAND gates 102 and 104 and a cascade of flip-flops 106–110. Digital integrator 40 accepts the rectified sixty Hz output of diodes 12 (FIG. 1) as a series of positive half sine-waves. Transistors 90 and 91 clip and limit the input to ground and Vdd. Buffer 98 shapes the rise and fall times to produce a much crisper digital signal that is input to flip-flop 96. SCLOCK provides a sampling clock frequency that allows flip-flops 106–109 to sample the incoming SYNC signal minimum number of times so that false triggering on noise does not occur. For example, if the output of buffer 98 goes high, the D-input of flip-flop 106 will be high. If this SYNC signal remains high for one pulse of SCLOCK, the Q-output of flip-flop 106 will go high. If SYNC is high on the second tick of SCLOCK, then the Q-output of flip-flop 107 will go high. If SYNC is still high on the third tick of SCLOCK, then the Q-output of flip-flop 108 will also go high. If SYNC remains high on the fourth tick of SCLOCK, then the Q-output of flip-flop 109 will go high. If SYNC is still high on the fifth tick of SCLOCK, flip-flop 110 will output 60HZSYNC and reset flip-flops 106–109 via NOR-gate 100. If at any time the SYNC output of buffer 98 goes low, flip-flops 106–109 will be reset before a high D-input can propagate to flip-flop 110. Flip-flop 110 is not reset by NAND-gate 104 to ensure a usable pulse width for 60HZSYNC. In this example, SYNC must be true for at least five ticks of SCLOCK. Certain applications may benefit from adding more stages to flip-flops 106–109 to increase the minimum number of SCLOCK samples of SYNC. Fewer stages may also be used with a greater risk of false triggering on noise.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A gaseous discharge lamp system, comprising:
   an output transformer having a natural resonant frequency Fn and a primary winding with a capacitor input and at least one secondary winding for direct connection to a gaseous discharge lamp and its filaments;
   a pair of output transistors connected in series across an input for a direct current source of power and having at their common junction a connection to said capacitor input of said primary winding of the output transformer such that said common junction may be alternatively switched by the output transistors between each polarity of said direct current source at a plurality of rates that includes a first switching rate to start said gaseous discharge lamps and a second switching rate to operate said gaseous discharge lamps;
   oscillator means connected to the pair of output transistors for controlling the switching rate of power applied to the output transformer relative to said frequency Fn; and
   synchronizing means connected to control the oscillator means and having an input for an alternating current source for phase locking the frequency output of the oscillator means to either said first switching rate to startup said gaseous discharge lamps or said second switching rate to operate said gaseous discharge lamps, wherein minor variations in the values of individual circuit components do not prevent operation of the oscillator at said switching rates.

2. The system of claim 1, wherein:
   the synchronizing means comprises a digital integrator for connection to said alternating current source and for sampling said alternating current source such that false triggering is avoided.

3. The system of claim 1, wherein:
   the oscillator means comprises a voltage controlled oscillator (VCO) with a phase locked loop circuit.

4. An electronic ballast for gaseous discharge lamp operation, comprising:
   a digital integrator connected to sample a synchronizing (SYNC) signal derived from an alternating current power source input and having an output that provides a reference frequency signal;
   a phase detector connected to said output of the digital integrator and having a feedback frequency input for comparing the frequency of a feedback signal to said reference frequency signal and having a comparison output;
   a phase locked loop (PLL) integrator connected to said comparison output of the phase detector and having a control output for adjusting an analog output control voltage in response to an output of the phase detector;
   a voltage controlled oscillator (VCO) having an output connected to provide in response to said control output a plurality of frequencies relative to a natural resonant frequency of a transformer driven by the VCO and connected to at least one gaseous discharge lamp which frequencies include a first frequency for operating a filament within said gaseous discharge lamp for startup and a second frequency for igniting said gaseous discharge lamp and for maintaining lamp luminescence; and
   a digital divider connected with an input to the VCO and an output to the phase detector for dividing the VCO output frequency such that at least said first and second frequencies may be produced by the VCO.

5. The ballast of claim 4, wherein the digital integrator comprises:
   clipping means connected to said alternating current power source input for limiting said SYNC signal such that the resulting signal is compatible with digital logic;
   hysteresis means connected to the clipping means for buffering said SYNC signal to digital logic;
   cascaded flip-flop means connected to the hysteresis means for sampling said SYNC signal at a minimum of five different points in time for preventing false triggering of said reference frequency.

6. The ballast of claim 4, wherein the digital divider comprises:
   counting means connected to said VCO output for dividing said VCO output frequency by 512; and
   sampling clock means connected to said VCO output for dividing said VCO output frequency such that at least four samples of said SYNC signal obtained by the digital integrator each period of said alternating current power source.

* * * * *